United States Patent
Dillon et al.

(10) Patent No.: US 11,910,558 B2
(45) Date of Patent: Feb. 20, 2024

(54) CHASSIS MANAGEMENT CONTROLLER MONITORED OVERCURRENT PROTECTION FOR MODULAR INFORMATION HANDLING SYSTEMS

(71) Applicant: Dell Products L.P., Round Rock, TX (US)

(72) Inventors: Geoffrey A. Dillon, Pflugerville, TX (US); Craig A. Klein, Elgin, TX (US); Arun Muthaiyan, Round Rock, TX (US); Nagesh Babu Venkata Doddapaneni, Taipei (TW); Mark Tsai, New Taipei (TW)

(73) Assignee: Dell Products L.P., Round Rock, TX (US)

( * ) Notice: Subject to any disclaimer, the term of this patent is extended or adjusted under 35 U.S.C. 154(b) by 497 days.

(21) Appl. No.: 17/229,602

(22) Filed: Apr. 13, 2021

(65) Prior Publication Data
US 2022/0330450 A1  Oct. 13, 2022

(51) Int. Cl.
  *H05K 7/14* (2006.01)
  *H05K 7/20* (2006.01)
  *G06F 1/28* (2006.01)

(52) U.S. Cl.
  CPC ............. *H05K 7/1498* (2013.01); *G06F 1/28* (2013.01); *H05K 7/1487* (2013.01); *H05K 7/1488* (2013.01); *H05K 7/1492* (2013.01); *H05K 7/20836* (2013.01)

(58) Field of Classification Search
  USPC ........................................................ 702/60
  See application file for complete search history.

(56) References Cited

U.S. PATENT DOCUMENTS

| | | | |
|---|---|---|---|
| 2014/0052309 A1* | 2/2014 | Chandrasekhar | G06F 1/266 700/297 |
| 2015/0058542 A1* | 2/2015 | Chao | H05K 7/1498 711/103 |
| 2015/0177813 A1* | 6/2015 | Bailey | G06F 1/3234 713/320 |
| 2015/0241945 A1* | 8/2015 | Dube | H05K 7/1492 713/320 |
| 2017/0139462 A1* | 5/2017 | Potlapally | G06F 11/3062 |
| 2017/0336855 A1* | 11/2017 | Ragupathi | G06F 1/28 |
| 2017/0336856 A1* | 11/2017 | Ragupathi | G06F 1/3234 |
| 2020/0315054 A1* | 10/2020 | Shen | G06F 1/3296 |

* cited by examiner

*Primary Examiner* — Paul D Lee
(74) *Attorney, Agent, or Firm* — Jackson Walker L.L.P.

(57) ABSTRACT

A system may include a chassis comprising a plurality of bays, each of the plurality of bays configured to receive a respective modular information handling system, a shared infrastructure comprising a plurality of components which are shared by modular information handling systems received in the plurality of bays, and a chassis management controller communicatively coupled to the plurality of bays and configured to determine a power consumption for each respective modular information handling system and if the power consumption for a respective modular information handling system exceeds a maximum sled connector current limit for the respective modular information handling system, communicate a message to the respective modular information handling system to power down the respective modular information handling system.

15 Claims, 7 Drawing Sheets

CHASSIS MANAGEMENT CONTROLLER MONITORED OVERCURRENT PROTECTION FOR MODULAR INFORMATION HANDLING SYSTEMS

TECHNICAL FIELD

The present disclosure relates in general to information handling systems, and more particularly to systems and methods for monitoring, by a chassis management controller, current consumption of modular information handling systems in a chassis in order to provide over-current protection for such modular information handling systems and their associated connectors.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Increasingly, information handling systems are being utilized in architectures including a system chassis with multiple modular information handling systems or "sleds" received therein and with a shared infrastructure of various peripheral and input/output capabilities common to the chassis as a whole which may be shared by the multiple modular information handling systems.

In existing approaches, a hardware protection policy may be executed on each sled in a system chassis so that power consumption on each sled is maintained lower than a thermal current limit of a mid-plane connector to which a sled is coupled. Further, an overcurrent protection circuit (OCP), such as a hot-swap controller OCP, may be configured to trip when a sled connector peak current limit is exceeded for a relatively short period of time. Such overcurrent and power limits may prevent overheating of components, such as the mid-plane connector, that may lead to damage of components and/or an exothermic event. Because transient peaks in processor power consumption have continued to trend higher with successive generations of processors, the gap between average sled power consumption and potential peak power consumption has grown substantially. As a result, a substantial gap may exist between a sled's thermal current limit and the OCP trip thresholds. Such gaps have become large enough that existing monitoring approaches may not be sufficient.

SUMMARY

In accordance with the teachings of the present disclosure, the disadvantages and problems associated with current monitoring of modular information handling systems in a system chassis may be reduced or eliminated.

In accordance with embodiments of the present disclosure, a system may include a chassis comprising a plurality of bays, each of the plurality of bays configured to receive a respective modular information handling system, a shared infrastructure comprising a plurality of components which are shared by modular information handling systems received in the plurality of bays, and a chassis management controller communicatively coupled to the plurality of bays and configured to determine a power consumption for each respective modular information handling system and if the power consumption for a respective modular information handling system exceeds a maximum sled connector current limit for the respective modular information handling system, communicate a message to the respective modular information handling system to power down the respective modular information handling system.

In accordance with these and other embodiments of the present disclosure, a method may include, in a system comprising a chassis comprising a plurality of bays, each of the plurality of bays configured to receive a respective modular information handling system, and the system further comprising a shared infrastructure comprising a plurality of components which are shared by modular information handling systems received in the plurality of bays: determining a power consumption for each respective modular information handling system and if the power consumption for a respective modular information handling system exceeds a maximum sled connector current limit for the respective modular information handling system, communicating a message to the respective modular information handling system to power down the respective modular information handling system.

In accordance with these and other embodiments of the present disclosure, an article of manufacture may include a non-transitory computer readable medium and computer-executable instructions carried on the computer readable medium, the instructions readable by a processor, the instructions, when read and executed, for causing the processor to, in a system comprising a chassis comprising a plurality of bays, each of the plurality of bays configured to receive a respective modular information handling system, and the system further comprising a shared infrastructure comprising a plurality of components which are shared by modular information handling systems received in the plurality of bays: determine a power consumption for each respective modular information handling system and if the power consumption for a respective modular information handling system exceeds a maximum sled connector current limit for the respective modular information handling system, communicate a message to the respective modular information handling system to power down the respective modular information handling system.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
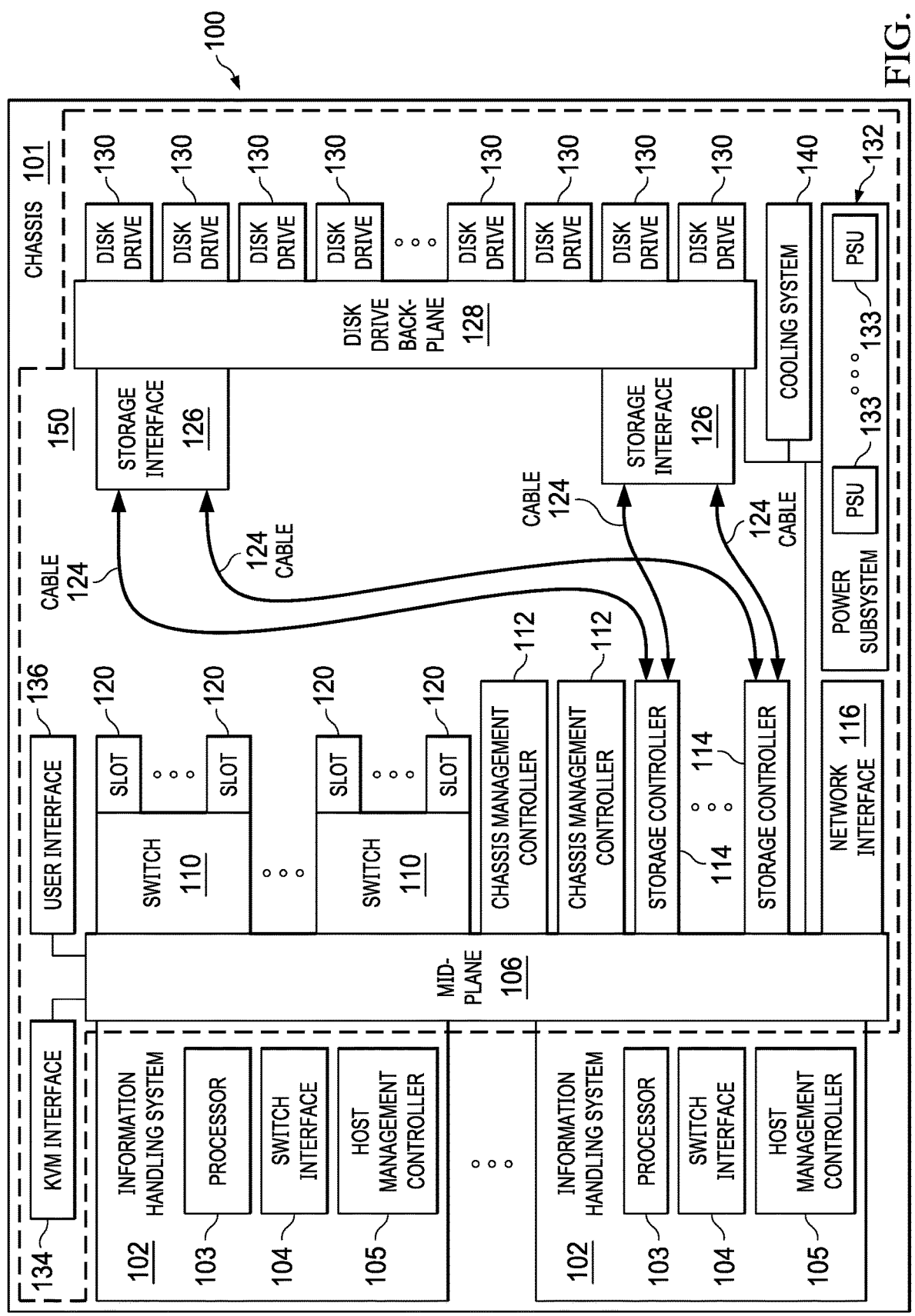
FIG. 1 illustrates a block diagram of an example system chassis with multiple information handling systems and with various shared infrastructure peripheral and I/O capabilities common to the chassis as a whole, in accordance with embodiments of the present disclosure.

Preferred embodiments and their advantages are best understood by reference to FIGS. 1 through 4, wherein like numbers are used to indicate like and corresponding parts. For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a personal digital assistant (PDA), a consumer electronic device, a network storage device, or any other suitable device and may vary in size, shape, performance, functionality, and price. The information handling system may include memory, one or more processing resources such as a central processing unit ("CPU") or hardware or software control logic. Additional components of the information handling system may include one or more storage devices, one or more communications ports for communicating with external devices as well as various I/O devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, buses, memories, I/O devices and/or interfaces, storage resources, network interfaces, motherboards, electro-mechanical devices (e.g., fans), displays, and power supplies.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory ("RAM"), read-only memory ("ROM"), electrically erasable programmable read-only memory ("EEPROM"), and/or flash memory; as well as communications media such as wires, optical fibers, microwaves, radio waves, and other electromagnetic and/or optical carriers; and/or any combination of the foregoing.

Information handling systems often use an array of physical storage resources (e.g., disk drives), such as a Redundant Array of Independent Disks ("RAID"), for example, for storing information. Arrays of physical storage resources typically utilize multiple disks to perform input and output operations and can be structured to provide redundancy which may increase fault tolerance. Other advantages of arrays of physical storage resources may be increased data integrity, throughput and/or capacity. In operation, one or more physical storage resources disposed in an array of physical storage resources may appear to an operating system as a single logical storage unit or "logical unit." Implementations of physical storage resource arrays can range from a few physical storage resources disposed in a chassis, to hundreds of physical storage resources disposed in one or more separate storage enclosures.

FIG. 1 illustrates a block diagram of an example system 100 having a chassis 101 with multiple information handling systems 102 and with a shared infrastructure including various peripheral and I/O capabilities common to chassis 101 as a whole, in accordance with embodiments of the present disclosure. As depicted in FIG. 1, system 100 may comprise a chassis 101 including a plurality of information handling systems 102, a mid-plane 106, one or more switches 110, one or more chassis management controllers 112, a network interface 116, one or more slots 120, one or more cables 124, one or more storage interfaces 126, a disk drive backplane 128, a plurality of disk drives 130, a power system 132, a keyboard-video-mouse ("KVM") interface 134, a user interface 136, and a cooling system 140.

An information handling system 102 may generally be operable to receive data from and/or communicate data to one or more disk drives 130 and/or other information handling resources of chassis 101 via mid-plane 106 and/or switches 110. In certain embodiments, an information handling system 102 may be a server. In such embodiments, an information handling system 102 may comprise a blade server having modular physical design. In these and other embodiments, an information handling system 102 may comprise an M class server. Throughout this disclosure, the terms "information handling system 102" and "sled 102" may be used interchangeably to mean the same thing. As depicted in FIG. 1, an information handling system 102 may include a processor 103, one or more switch interfaces 104 communicatively coupled to processor 103, and a host management controller 105 communicatively coupled to processor 103.

A processor 103 may include any system, device, or apparatus configured to interpret and/or execute program instructions and/or process data, and may include, without limitation, a microprocessor, microcontroller, digital signal processor ("DSP"), application specific integrated circuit ("ASIC"), or any other digital or analog circuitry configured to interpret and/or execute program instructions and/or process data. In some embodiments, processor 103 may interpret and/or execute program instructions and/or process data stored in a memory, a disk drive 130, and/or another component of system 100.

A switch interface 104 may comprise any system, device, or apparatus configured to provide an interface between its associated information handling system 102 and switches 110. In some embodiments, switches 110 may comprise Peripheral Component Interconnect Express ("PCIe") switches, in which case a switch interface 104 may comprise a switch card configured to create a PCIe-compliant interface between its associated information handling system 102 and switches 110. In other embodiments, a switch interface 104 may comprise an interposer. Use of switch interfaces 104 in information handling systems 102 may allow for minimal changes to be made to traditional servers (e.g., M class servers) while supporting the overall system architecture disclosed herein. Although FIG. 1 depicts an implementation including a single switch interface 104 per information handling system 102, in some embodiments each information handling system 102 may include a plurality of switch interfaces 104 for redundancy, high availability, and/or other reasons.

A host management controller 105 may be implemented by, for example, a microprocessor, microcontroller, DSP, ASIC, EEPROM, or any combination thereof. Host management controller 105 may be configured to communicate with one or more of chassis management controllers 112 via mid-plane 106 (e.g., via an Ethernet management fabric). Host management controller 105 may be configured to provide out-of-band management facilities for management of information handling system 102. Such management may be made by elements of chassis 101 even if information handling system 102 is powered off or powered to a standby state. Host management controller 105 may include a processor, memory, and network connection separate from the rest of information handling system 102. In certain embodiments, host management controller 105 may include or may be an integral part of a baseboard management controller (BMC), Dell Remote Access Controller (DRAC) or an Integrated Dell Remote Access Controller (iDRAC).

Mid-plane 106 may comprise any system, device, or apparatus configured to interconnect modular information handling systems 102 with information handling resources. Accordingly, mid-plane 106 may include slots and/or connectors configured to receive information handling systems 102, switches 110, chassis controller 112, storage controllers 114, network interface 116, KVM interface 134, user interface 136, and/or other information handling resources. In one embodiment, mid-plane 106 may include a single board configured to interconnect modular information handling systems 102 with information handling resources. In another embodiment, mid-plane 106 may include multiple boards configured to interconnect modular information handling systems 102 with information handling resources. In yet another embodiment, mid-plane 106 may include cabling configured to interconnect modular information handling systems 102 with information handling resources.

A switch 110 may comprise any system, device, or apparatus configured to couple information handling systems 102 to storage controllers 114 (e.g., via mid-plane 106) and slots 120 and perform switching between information handling systems 102 and various information handling resources of system 100, including storage controllers 114 and slots 120. In certain embodiments, a switch 110 may comprise a PCIe switch. In other embodiments, a switch may comprise a generalized PC bus switch, an Infiniband switch, or other suitable switch. As shown in FIG. 1, chassis 101 may include a plurality of switches 110. In such embodiments, switches 110 may operate in a redundant mode for shared devices (e.g., storage controllers 114 and/or devices coupled to slots 120) and in a non-redundant mode for non-shared/zoned devices. As used herein, shared devices may refer to those devices which may be visible to more than one information handling system 102, while non-shared devices may refer to those devices which are visible to only a single information handling system 102. In some embodiments, mid-plane 106 may include a single switch 110.

Chassis management controllers 112 may be any system, device, or apparatus configured to facilitate management and/or control of system 100, its information handling systems 102, and/or one or more of its component information handling resources. Chassis management controllers 112 may be configured to issue commands and/or other signals to manage and/or control information handling system 102 and/or information handling resources of system 100. Chassis management controllers 112 may comprise a microprocessor, microcontroller, DSP, ASIC, field programmable gate array ("FPGA"), EEPROM, or any combination thereof. As shown in FIG. 1, chassis management controllers 112 may be coupled to mid-plane 106. In some embodiments, a chassis management controller 112 may provide a user interface and high level controls for management of switches 110, including configuring assignments of individual information handling systems 102 to non-shared information handling resources of system 100. In these and other embodiments, a chassis management controller 112 may define configurations of the storage subsystem (e.g., storage controllers 114, storage interfaces 126, disk drives 130, etc.) of system 100. For example, a chassis controller 112 may provide physical function configuration and status information that would normally occur at the driver level in traditional server implementations. Examples of physical functions include disk drive discovery and status, RAID configuration, and logical volume mapping.

In addition or alternatively, a chassis management controller 112 may also provide a management console for user/administrator access to these functions. For example, a chassis management controller 112 may implement Web Services Management ("WS-MAN") or another suitable management protocol permitting a user to remotely access a chassis management controller 112 to configure system 100 and its various information handling resources. In such embodiments, a chassis management controller 112 may interface with a network interface separate from network interface 116, thus allowing for "out-of-band" control of system 100, such that communications to and from chassis management controller 112 are communicated via a management channel physically isolated from an "in band" communication channel with network interface 116. Thus, for example, if a failure occurs in system 100 that prevents an administrator from interfacing with system 100 via network interface 116 and/or user interface 136 (e.g., operating system failure, power failure, etc.), the administrator may still be able to monitor and/or manage system 100 (e.g., to diagnose problems that may have caused failure) via a chassis management controller 112. In the same or alternative embodiments, chassis management controller 112 may allow an administrator to remotely manage one or more parameters associated with operation of system 100 and its various information handling resources (e.g., power usage, processor allocation, memory allocation, security privileges, etc.). A chassis management controller 112 may also be known as a satellite controller.

A storage controller 114 may include any system, apparatus, or device operable to manage the communication of data between one or more of information handling systems 102 and one or more of disk drives 130. In certain embodiments, a storage controller 114 may provide functionality including, without limitation, disk aggregation and redundancy (e.g., RAID), I/O routing, and error detection and recovery. As shown in FIG. 1, a storage controller 114 may be coupled to a connector on a switch 110. Also as shown in FIG. 1, system 100 may include a plurality of storage controllers 114, and in such embodiments, storage controllers 114 may be configured as redundant. In addition or in the alternative, storage controllers 114 may in some embodiments be shared among two or more information handling systems 102. As also shown in FIG. 1, each storage controller 114 may be coupled to one or more storage interfaces 126 via cables 124. For example, in some embodiments, each storage controller 114 may be coupled to a single associated storage interface 126 via a cable 124. In other embodiments, each storage controller 114 may be coupled to two or more storage interfaces 126 via a plurality of cables 124, thus permitting redundancy as shown in FIG. 1. Storage controllers 114 may also have features supporting shared storage and high availability. For example, in PCIe implementations, a unique PCIe identifier may be used to indicate shared storage capability and compatibility in system 100.

As depicted in FIG. 1, switch 110 may have coupled thereto one or more slots 120. A slot 120 may include any system, device, or apparatus configured to allow addition of one or more expansion cards to chassis 101 in order to electrically couple such expansion cards to a switch 110. Such slots 120 may comprise any suitable combination of full-height risers, full-height slots, and low-profile slots. A full-height riser may include any system, device, or apparatus configured to allow addition of one or more expansion cards (e.g., a full-height slot) having a physical profile or form factor with dimensions that practically prevent such expansion cards to be coupled in a particular manner (e.g., perpendicularly) to mid-plane 106 and/or switch 110 (e.g., the proximity of information handling resources in chassis 101 prevents physical placement of an expansion card in such a manner). Accordingly, a full-height riser may itself physically couple with a low-profile slot to mid-plane 106, a switch 110, or another component, and full-height cards may then be coupled to full-height slots of a full-height riser. On the other hand, low-profile slots may be configured to couple low-profile expansion cards to switches 110 without the need for a full-height riser.

Slots 120 may also include electrically conductive elements (e.g., edge connectors, traces, etc.) allowing for expansion cards inserted into slots 120 to be electrically coupled to switches 110. In operation, switches 110 may manage switching of communications between individual information handling systems 102 and expansion cards coupled to slots 120. In some embodiments, slots 120 may be nonshared (e.g., each slot 120 is associated with a single information handling system 102). In other embodiments, one or more of slots 120 may be shared among two or more information handling systems 102. In these and other embodiments, one or more slots 120 may be configured to be compatible with PCIe, generalized PC bus switch, Infiniband, or another suitable communication specification, standard, or protocol.

Network interface 116 may include any suitable system, apparatus, or device operable to serve as an interface between chassis 101 and an external network (e.g., a local area network or other network). Network interface 116 may enable information handling systems 102 to communicate with the external network using any suitable transmission protocol (e.g., TCP/IP) and/or standard (e.g., IEEE 802.11, Wi-Fi). In certain embodiments, network interface 116 may include a network interface card ("NIC"). In the same or alternative embodiments, network interface 116 may be configured to communicate via wireless transmissions. In the same or alternative embodiments, network interface 116 may provide physical access to a networking medium and/or provide a low-level addressing system (e.g., through the use of Media Access Control addresses). In some embodiments, network interface 116 may be implemented as a local area network ("LAN") on motherboard ("LOM") interface.

In some embodiments, various components of chassis 101 may be coupled to a planar. For example, a planar may interconnect switches 110, chassis management controllers 112, storage controllers 114, network interface 116, power system 132, KVM interface 134, user interface 136, and/or other modular information handling resources of chassis 101 to mid-plane 106 of system 100. Accordingly, such planar may include slots and/or connectors configured to interconnect with such information handling resources.

Storage interfaces 126 may include any system, device, or apparatus configured to facilitate communication between storage controllers 114 and disk drives 130. For example, a storage interface 126 may serve to permit a relatively small number of communication links (e.g., two) between storage controllers 114 and storage interfaces 126 to communicate with a greater number (e.g., 25) of disk drives 130. Thus, a storage interface 126 may provide a switching mechanism and/or disk drive addressing mechanism that allows an information handling system 102 to communicate with numerous disk drives 130 via a limited number of communication links and/or channels. Accordingly, a storage interface 126 may operate like an Ethernet hub or network switch that allows multiple systems to be coupled using a single switch port (or relatively few switch ports). A storage interface 126 may be implemented as an expander (e.g., a Serial Attached SCSI ("SAS") expander), an Ethernet switch, a FibreChannel switch, Internet Small Computer System Interface (iSCSI) switch, or any other suitable switch. In order to support high availability storage, system 100 may implement a plurality of redundant storage interfaces 126, as shown in FIG. 1.

Disk drive backplane 128 may comprise any system, device, or apparatus configured to interconnect modular storage interfaces 126 with modular disk drives 130. Accordingly, disk drive backplane 128 may include slots and/or connectors configured to receive storage interfaces 126 and/or disk drives 130. In some embodiments, system 100 may include two or more backplanes, in order to support differently-sized disk drive form factors. To support redundancy and high availability, a disk drive backplane 128 may be configured to receive a plurality (e.g., 2) of storage interfaces 126 which couple two storage controllers 114 to each disk drive 130.

Each disk drive 130 may include computer-readable media (e.g., magnetic storage media, optical storage media, opto-magnetic storage media, and/or other type of rotating storage media, flash memory, and/or other type of solid state storage media) and may be generally operable to store data and/or programs (e.g., one or more operating systems and/or one or more application programs). Although disk drives 130 are depicted as being internal to chassis 101 in FIG. 1, in some embodiments, one or more disk drives 130 may be located external to chassis 101 (e.g., in one or more enclosures external to chassis 101).

Power system 132 may be coupled to mid-plane 106, disk drive back-plane 128, cooling system 140, and/or other components of system 100 and may include one or more power supply units (PSUs) 133 configured to generate and deliver electrical energy to components of system 100. Thus, power system 132 may include its own backplane with slots and associated bays for receiving PSUs 133 and electrically coupling such PSUs 133 to other components of system 100. Generally speaking, a PSU 133 may include any system, device, or apparatus configured to supply electrical current to one or more information handling resources of system 100.

KVM interface 134 may be coupled to mid-plane 106 and may include any suitable system, apparatus, or device configured to couple to one or more of a keyboard, video display, and mouse and act as a switch between multiple information handling systems 102 and the keyboard, video display, and/or mouse, thus allowing a user to interface with a plurality of information handling systems 102 via a single keyboard, video display, and/or mouse.

User interface 136 may include any system, apparatus, or device via which a user may interact with system 100 and its various information handling resources by facilitating input from a user allowing the user to manipulate system 100 and output to a user allowing system 100 to indicate effects of the user's manipulation. For example, user interface 136 may include a display suitable for creating graphic images and/or alphanumeric characters recognizable to a user, and may include, for example, a liquid crystal display, cathode ray tube, a plasma screen, and/or a digital light processor projection monitor. In certain embodiments, such a display may be an integral part of chassis 101 and receive power from power supplies (not explicitly shown) of chassis 101, rather than being coupled to chassis 101 via a cable. In some embodiments, such display may comprise a touch screen device capable of receiving user input, wherein a touch sensor may be mechanically coupled or overlaid upon the display and may comprise any system, apparatus, or device suitable for detecting the presence and/or location of a tactile touch, including, for example, a resistive sensor, capacitive sensor, surface acoustic wave sensor, projected capacitance sensor, infrared sensor, strain gauge sensor, optical imaging sensor, dispersive signal technology sensor, and/or acoustic pulse recognition sensor. In these and other embodiments, user interface 136 may include other user interface elements (e.g., a keypad, buttons, and/or switches placed in proximity to a display) allowing a user to provide input to system 100. User interface 136 may be coupled to chassis management controllers 112 and/or other components of system 100, and thus may allow a user to configure various information handling resources of system 100 (e.g., assign individual information handling systems 102 to particular information handling resources).

Cooling system 140 may comprise any system, device, or apparatus for cooling components of chassis 101. For example, cooling system 140 may comprise air movers (e.g., fans or blowers) for causing a cooling air flow over components of chassis 101, a liquid coolant conveyance network for distributing a cooling liquid to components of chassis 101, and/or any other system suitable for cooling components of chassis 101. In some embodiments, such cooling system may also include sensors (e.g., temperature sensors) and/or control logic for controlling operational parameters (e.g., rotational speeds of motors of air movers) of cooling system 140.

As shown in FIG. 1, various components of system 100 may be part of a shared infrastructure 150 common to chassis 101 and shared by the various information handling systems 102.

In operation, as described in greater detail below, the active chassis management controller 112 may poll host management controller 105 of each sled 102 for the respective power consumption reading from the hot-swap controller or other suitable component of such sled 102. If power consumption for a sled 102 exceeds a maximum sled connector current limit for a maximum allowable time threshold, chassis management controller 112 may attempt to shut down the sled via an Intelligent Platform Management Interface (IPMI) message to the host management controller 105 of such sled 102. If a sled 102 does not power down within a maximum shutdown time limit, chassis management controller 112 may power off chassis 101 and its components by disabling PSUs 133.

In the event that chassis management controller 112 loses communication with a host management controller 105 and can no longer obtain a valid power reading for a sled 102 from such host management controller 105, chassis management controller 112 may estimate a power consumption of the sled 102, as described in greater detail below.

Such functionality of chassis management controller 112 may mitigate the effects of a resistive short and the possibility of an exothermic event.

Methods 200, 300, and 400 as described below detail such functionality of chassis management controllers 112. The description of method 200, 300, and 400 includes numerous over-current monitoring variables, which are defined in the table below:

| Variable | Description |
| --- | --- |
| OC_TO | Time threshold for a sled connector maximum overcurrent event to cause a sled shutdown. |
| CM_OC | Current threshold (in amps) for a sled connector maximum overcurrent event. |
| Sled[N:1].OC_Tmr | Array of timers, one per sled 102, timing the duration of a sled connector maximum overcurrent event. |
| Sled[N:1].OC | Array of Boolean flags, one per sled 102, indicating a sled connector maximum overcurrent event is active. |
| Sled[N:1].SD | Array of Boolean flags for tracking each sled 102, indicating a sled connector maximum overcurrent shutdown event is active. |
| PSU[2:1].Pout | Array of output power measurements, one for each PSU 133 (in watts). |
| Fan.Pwr | Power consumption measurement (in watts) of air movers of cooling system 140. |
| Fan.MissedRds | Number of consecutive failed reads of the current monitor for air movers of cooling system 140. |
| BP.Pwr | Power consumption measurement (in watts) for mid-plane 106. |
| BP.DfltPwr | Default power consumption for mid-plane 106, determined by type. |
| BP.MissedRds | Number of consecutive failed reads of the current monitor for mid-plane 106. |
| CM.Pwr | Chassis management controller 112 power consumption estimate (in watts). |
| Sled[N:1].Pwr | Array of sled power consumption measurements, one per sled 102 (in watts). |
| Sled[N:1].PwrRd | Array of flags indicating power was read successfully, one flag per sled 102. Value is either '0' or '1'. |
| Slot | PSU 133 slot indicator. |
| SlotCount | Number of chassis slots for PSUs 133. |
| Bay | Bay indicator for a sled 102. |

| Variable | Description |
| --- | --- |
| BayCount | Number of chassis bays for sleds 102. |
| MissedSledRds | Number of failed reads of sled power per sample period by chassis management controller 112. |

Figure 2A:
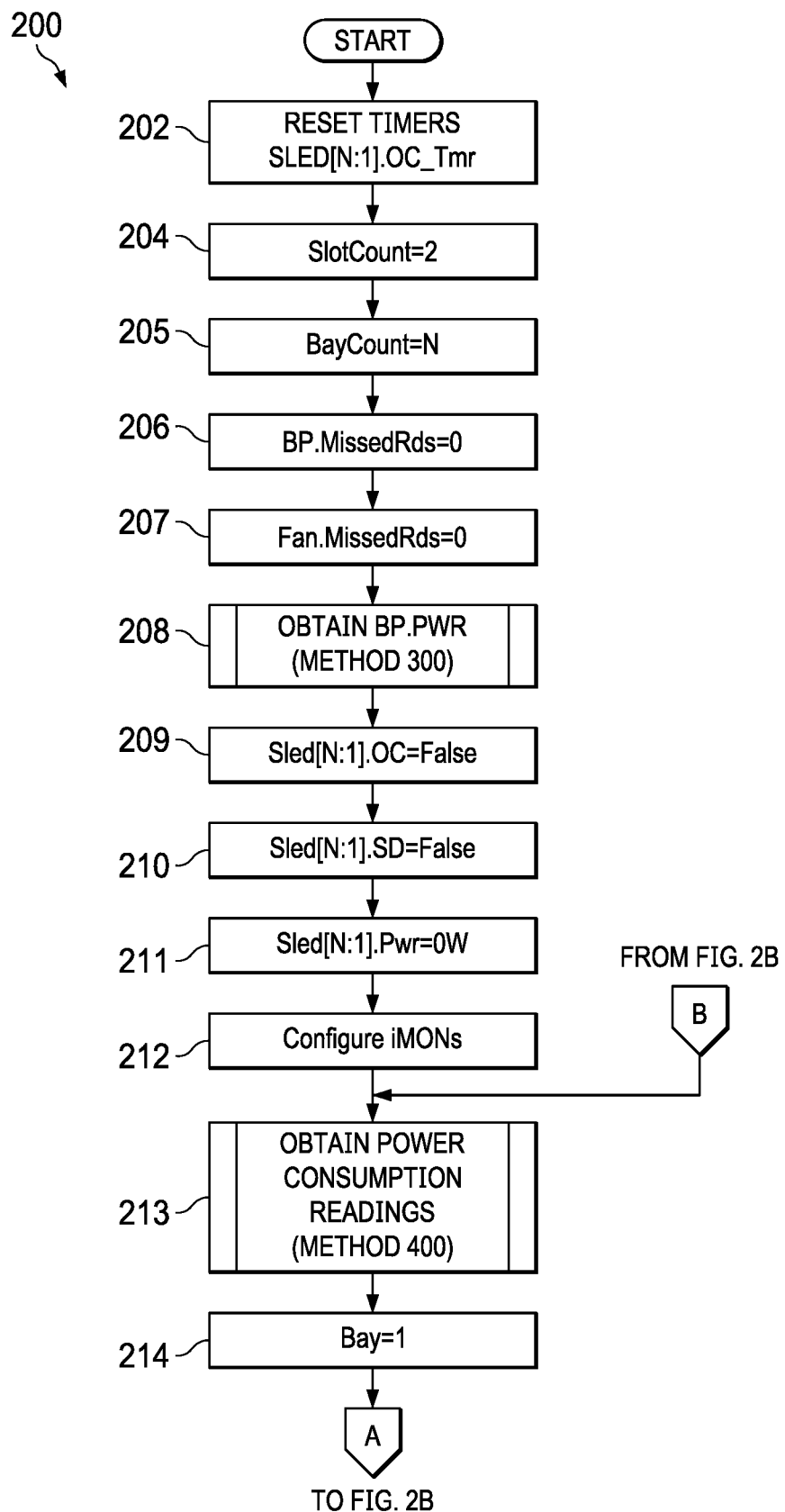
FIGS. 2A and 2B (which may be collectively referred to as "FIG. 2" herein) illustrate a flow chart of an example method for chassis management controller over-current monitoring, in accordance with embodiments of the present disclosure.
Figure 2B:
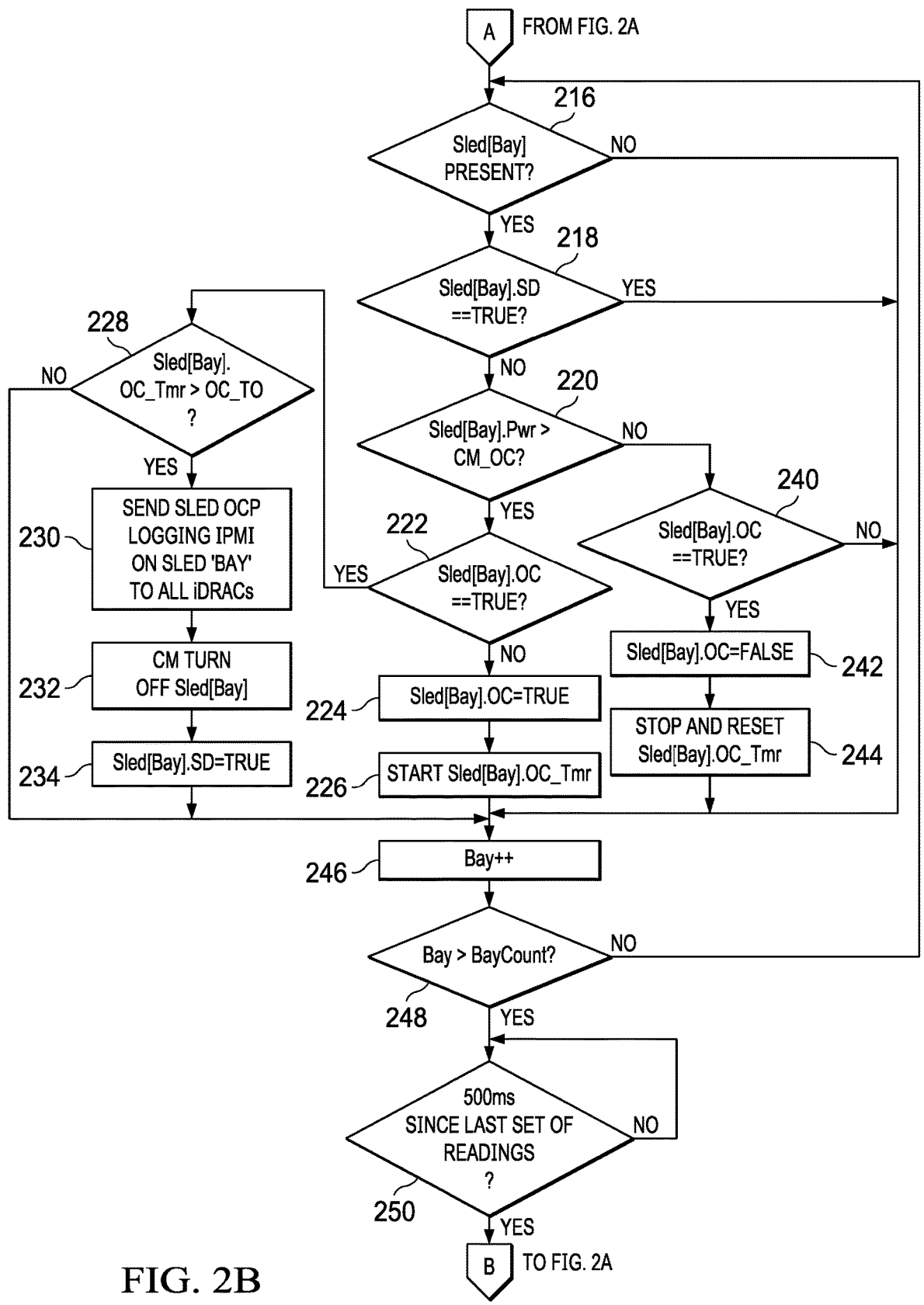

FIG. 2 illustrates a flow chart of an example method for chassis management controller 112 over-current monitoring, in accordance with embodiments of the present disclosure. According to certain embodiments, method 200 may begin at step 202. As noted above, teachings of the present disclosure may be implemented in a variety of configurations of system 100 as shown in FIG. 1. As such, the preferred initialization point for method 200 and the order of the steps comprising method 200 may depend on the implementation chosen. In these and other embodiments, method 200 may be implemented as firmware, software, applications, functions, libraries, or other instructions.

At step 202, chassis management controller 112 may reset the array of four timers "Sled[N:1].OC_Tmr." Each timer of the array of timers "Sled[N:1].OC_Tmr" may be used to track the amount of time that an associated sled 102 has reported power readings greater than the sled connector average current limit, "CM_OC." For illustrative purposes, it is assumed four sleds 102 are present. However, method 200 may be modified as necessary for a fewer number of sleds 102 or a greater number of sleds 102.

At step 204, chassis management controller 112 may set the variable "SlotCount" to the number of slots for PSUs 133 present in chassis 100. For illustrative purposes, in this description, the number of slots for PSUs 133 is set to 2. However, it is understood that power system 132 may include any suitable number of slots for PSUs 133, and variable "SlotCount" may be set accordingly.

At step 205, chassis management controller 112 may set the variable "BayCount" to the number, N, of bays for sleds 102 present in chassis 100. However, it is understood that power system 132 may include any suitable number of bays for sleds 102 and variable "BayCount" may be set accordingly.

At step 206, chassis management controller 112 may initialize the variable "BP.MissedRds" to 0. Similarly, at step 207, chassis management controller 112 may initialize the variable "Fan.MissedRds" to 0.

At step 208, chassis management controller 112 may execute a sub-process for obtaining "BP.Pwr," the power consumption measurement for disk drive backplane 128. In this sub-process, which is described in greater detail below as method 300, chassis management controller 112 may read the backplane-type general purpose input/output (GPIO) information and determine therefrom a configuration for disk drive backplane 128. Based on the configuration, chassis management controller 112 may derive and store default backplane power "BP.DfltPwr."

At step 209, chassis management controller 112 may set the members of the array of the four Boolean variables "Sled[N:1].OC" to FALSE. When a Boolean array member "Sled[Bay].OC" is TRUE, it indicates that the previous power reading for the associated sled 102 exceeded the sled connector current limit. When the Boolean array member "Sled[Bay].OC" is FALSE, it indicates that the previous power reading for the associated sled 102 did not exceed the sled connector current limit.

At step 210, chassis management controller 112 may set the members of the array of the four Boolean variables "Sled[N:1].SD" to FALSE. When a Boolean array member "Sled[Bay].SD" is TRUE, it indicates that the associated sled 102 has been requested to power down due to a sled connector over-current event and the shutdown of the sled 102 is being timed by the timer "Sled[Bay].SD_Tmr."

At step 211, chassis management controller 112 may initialize the array of four sled power readings "Sled[N:1].Pwr" are initialized to 0 watts.

At step 212, chassis management controller 112 may configure various current monitors for system 100, including a current monitor for disk drive backplane 128 and a current monitor for air movers of cooling system 140.

At step 213, chassis management controller 112 may execute a sub-process for obtaining power consumption readings for major components of system 100, as well as the output power supplied by each of the PSUs 133. Such sub-process may be described in greater detail below as method 400.

At step 214, chassis management controller 112 may initialize variable 'Bay' to point to the first sled bay.

At step 216, chassis management controller 112 may determine if a sled bay indicated by the variable "Bay" is populated with a sled 102. If a sled 102 is present in the bay, method 200 may proceed to step 218. Otherwise, method 200 may proceed to step 246.

At step 218, chassis management controller 112 may determine if sled 102 has been shut down due to a sled connector overcurrent event, as indicated by Boolean flag "Sled[Bay].SD" being true. If sled 102 has been shut down due to a sled connector overcurrent event, method 200 may proceed to step 246. Otherwise, method 200 may proceed to step 220.

At step 220, chassis management controller 112 may determine if the sled power consumption for the sled 102, as stored as variable "Sled[Bay].Pwr" is greater than the sled connector overcurrent threshold "CM_OC." If "Sled[Bay].Pwr" is greater than the sled connector overcurrent threshold "CM_OC," method 200 may proceed to step 222. Otherwise, method 200 may proceed to step 240.

At step 222, chassis management controller 112 may determine if the previous sled power reading also exceeded the overcurrent threshold, as indicated by "Sled[Bay].OC" being TRUE. If "Sled[Bay].OC" is FALSE, method 200 may proceed to step 224. Otherwise, method 200 may proceed to step 228.

At step 224, chassis management controller 112 may set Boolean flag "Sled[Bay].OC" to TRUE for the next sample loop. At step 226, chassis management controller 112 may start timer "Sled[Bay].OC_Tmr", timing the duration that the power for sled 102 exceeds the sled connector power limit. After completion of step 226, method 200 may proceed to step 246.

At step 228, chassis management controller 112 may determine if timer "Sled[Bay]._" has exceeded the sled connector overcurrent timeout value "OC_TO." If timer "Sled[Bay].OC_Tmr" has exceeded the sled connector overcurrent timeout value "OC_TO," method 200 may proceed to step 230. Otherwise, method 200 may proceed to step 246.

At step 230, chassis management controller 112 may initiate a shutdown of sled 102 to prevent an exothermic event. Thus, at step 230, chassis management controller 112 may communicate an IPMI command to host management controller 105 for all sleds 102 indicating that chassis management controller 112 has detected a sled connector overcurrent condition for sled 102 in the bay indicated by variable "Bay." In response, each host management controller 105 may log an event due to receiving the IPMI command. At step 232, chassis management controller 112 may power off the 102 and hold sled 102 in the powered down state. At step 234, chassis management controller 112 may set Boolean variable "Sled[Bay].SD" to TRUE, indicating that sled 102 is being shut down due to a sled connector maximum overcurrent. After completion of step 234, method 200 may proceed to step 246.

At step 240, chassis management controller 112 may determine if Boolean variable "Sled[Bay].OC" is TRUE. If Boolean variable "Sled[Bay].OC" is TRUE, indicating the previous sled power reading was greater than the sled over-current protection threshold "CM_OC," method 200 may proceed to step 242. Otherwise, method 200 may proceed to step 246.

At step 242, chassis management controller 112 may set Boolean variable "Sled[Bay].OC" to FALSE. At step 244, chassis management controller 112 may stop and reset the timer "Sled[Bay].OC_Tmr" associated with sled "Bay". The CM logic then flows to step 246 to increment the sled indicator 'Bay' as previously described.

At step 246, chassis management controller 112 may increment variable "Bay" to move to the next bay. At step 248, chassis management controller 112 may determine if all bays have been checked. If not all bays have been checked, method 200 may proceed again to step 216. Otherwise, method 200 may proceed to step 250.

At step 250, chassis management controller 112 may determine if a period of time (e.g., 500 milliseconds) has passed since the last acquisition of power consumption readings. If the period of time has passed, method 200 may proceed again to step 213. Otherwise, method 200 may remain at step 250 until the period of time has passed.

Although FIG. 2 discloses a particular number of steps to be taken with respect to method 200, method 200 may be executed with greater or fewer steps than those depicted in FIG. 2. In addition, although FIG. 2 discloses a certain order of steps to be taken with respect to method 200, the steps comprising method 200 may be completed in any suitable order.

Method 200 may be implemented using system 100, components thereof, or any other system such as those shown in FIG. 1 operable to implement method 200. In certain embodiments, method 200 may be implemented partially or fully in software and/or firmware embodied in computer-readable media.

Figure 3:
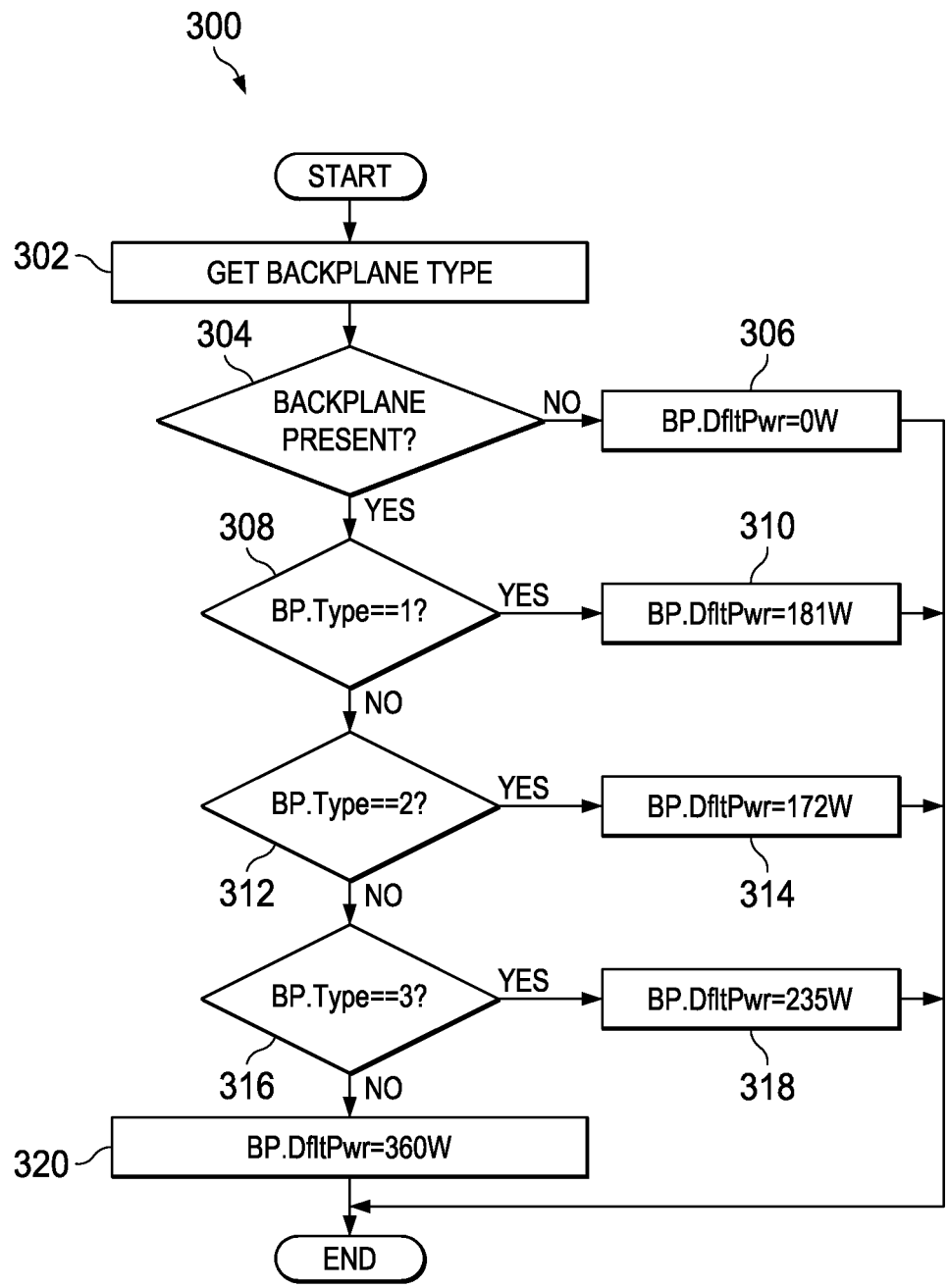
FIG. 3 illustrates a flow chart of an example method for obtaining a backplane power consumption estimate, in accordance with embodiments of the present disclosure.

FIG. 3 illustrates a flow chart of example method 300 for obtaining a backplane power consumption estimate, in accordance with embodiments of the present disclosure. According to certain embodiments, method 300 may begin at step 302. As noted above, teachings of the present disclosure may be implemented in a variety of configurations of system 100 as shown in FIG. 1. As such, the preferred initialization point for method 300 and the order of the steps comprising method 300 may depend on the implementation chosen. In these and other embodiments, method 300 may be implemented as firmware, software, applications, functions, libraries, or other instructions.

At step 302, chassis management controller 112 may read GPIO information that may indicate a backplane type for disk-drive backplane 128. At step 304, chassis management controller 112 may check for the presence of a disk-drive backplane 128. If disk-drive backplane 128 is present, method 300 may proceed to step 308. Otherwise, method 300 may proceed to step 306, wherein chassis management controller 112 may set variable "BP.DfltPwr" to 0 watts. After completion of step 306, method 300 may end.

At step 308, chassis management controller 112 may determine if disk-drive backplane 128 is of backplane type 1. If disk-drive backplane 128 is not of backplane type 1, method 300 may proceed to step 312. Otherwise, if disk-drive backplane 128 is of backplane type 1, method 300 may proceed to step 310, wherein chassis management controller 112 may set variable "BP.DfltPwr" to a default power level associated with type 1 (e.g., 181 watts). After completion of step 310, method 300 may end.

At step 312, chassis management controller 112 may determine if disk-drive backplane 128 is of backplane type 2. If disk-drive backplane 128 is not of backplane type 2, method 300 may proceed to step 316. Otherwise, if disk-drive backplane 128 is of backplane type 2, method 300 may proceed to step 314, wherein chassis management controller 112 may set variable "BP.DfltPwr" to a default power level associated with type 2 (e.g., 172 watts). After completion of step 314, method 300 may end.

At step 316, chassis management controller 112 may determine if disk-drive backplane 128 is of backplane type 3. If disk-drive backplane 128 is not of backplane type 3, method 300 may proceed to step 320. Otherwise, if disk-drive backplane 128 is of backplane type 3, method 300 may proceed to step 318, wherein chassis management controller 112 may set variable "BP.DfltPwr" to a default power level associated with type 3 (e.g., 235 watts). After completion of step 318, method 300 may end.

At step 320, chassis management controller 112 may set variable "BP.DfltPwr" to a default power level representing a worst case backplane power consumption (e.g., 360 watts). After completion of step 320, method 300 may end.

Although FIG. 3 discloses a particular number of steps to be taken with respect to method 300, method 300 may be executed with greater or fewer steps than those depicted in FIG. 3. In addition, although FIG. 3 discloses a certain order of steps to be taken with respect to method 300, the steps comprising method 300 may be completed in any suitable order.

Method 300 may be implemented using system 100, components thereof, or any other system such as those shown in FIG. 1 operable to implement method 300. In certain embodiments, method 300 may be implemented partially or fully in software and/or firmware embodied in computer-readable media.

Figure 4A:
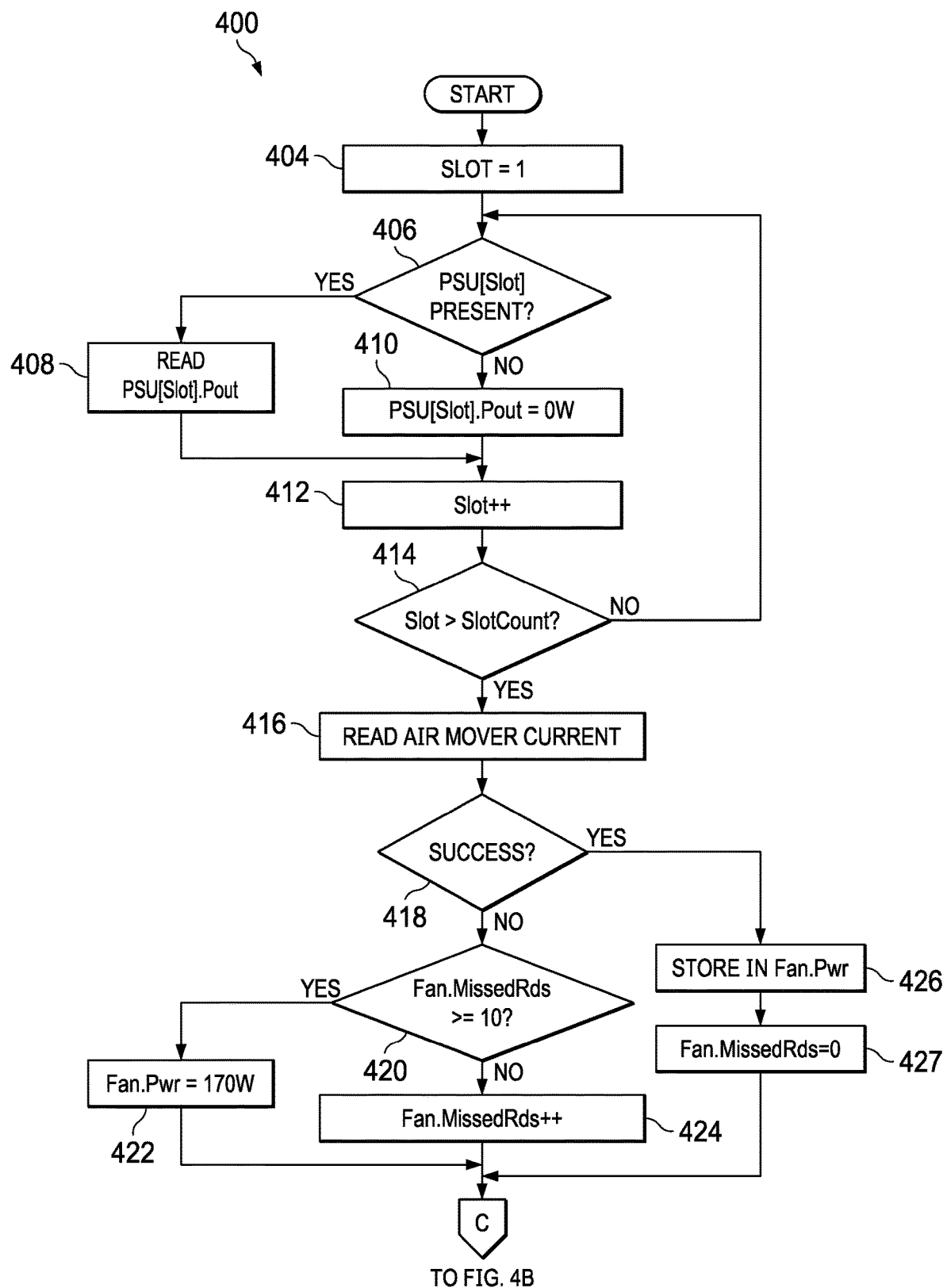
FIGS. 4A-4C (which may be collectively referred to as "FIG. 4" herein) illustrate a flow chart of an example method for obtaining power consumption readings for components of the system shown in FIG. 1, in accordance with embodiments of the present disclosure.
Figure 4B:
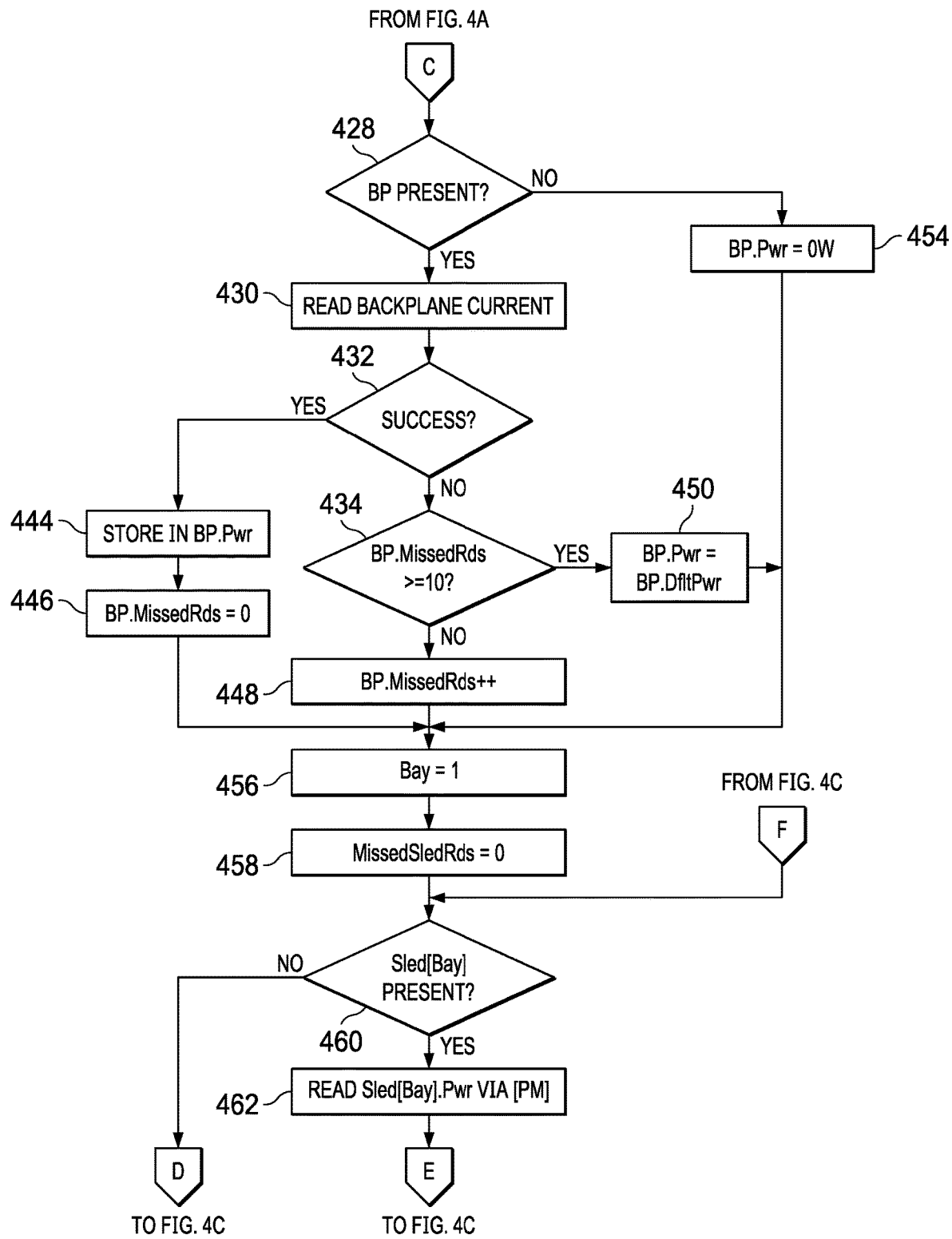
Figure 4C:
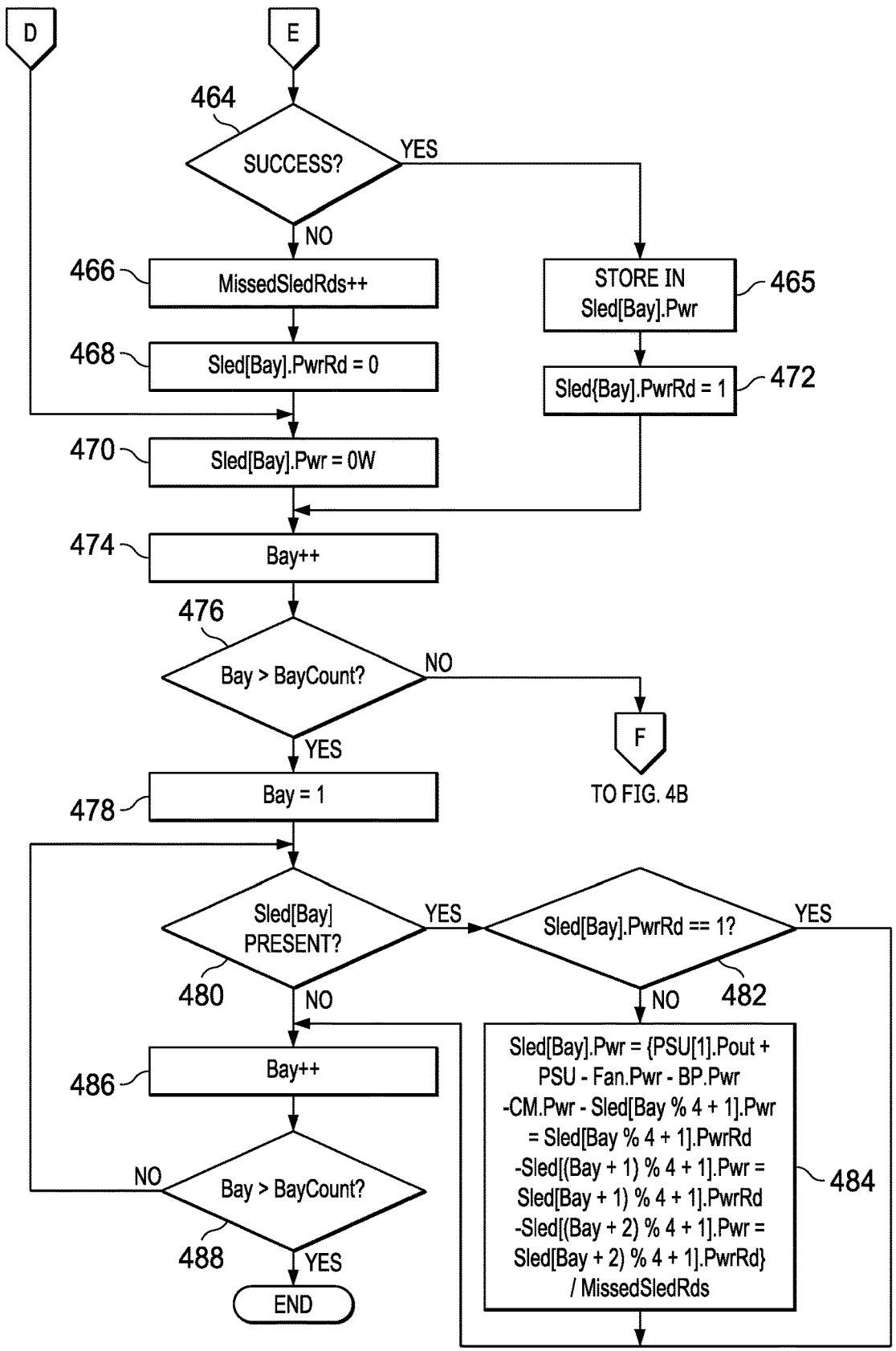

FIG. 4 illustrates a flow chart of example method 400 for obtaining power consumption readings for components of system 100, in accordance with embodiments of the present disclosure. According to certain embodiments, method 400 may begin at step 404. As noted above, teachings of the present disclosure may be implemented in a variety of configurations of system 100 as shown in FIG. 1. As such, the preferred initialization point for method 400 and the order of the steps comprising method 400 may depend on the implementation chosen. In these and other embodiments, method 400 may be implemented as firmware, software, applications, functions, libraries, or other instructions.

At step 404, chassis management controller 112 may initialize variable "Slot" to "1." Variable "Slot" may indicate a current PSU slot being processed. At step 406, chassis management controller 112 may determine if a PSU 133 is present in the slot indicated by variable "Slot." If a PSU 133 is present in the slot indicated by variable "Slot," method may proceed to step 408. Otherwise, method 400 may proceed to step 410.

At step 408, chassis management controller 112 may read the output power being supplied by PSU 133 in the enumerated slot and store it in the variable "PSU[Slot].Pout." After completion of step 408, method 400 may proceed to step 412.

At step 410, in response to no PSU 133 being present in the enumerated slot, chassis management controller 112 may set variable "PSU[Slot].Pout" for such slot to 0 watts.

At step 412, chassis management controller 112 may increment variable "Slot." At step 414, chassis management controller 112 may determine if all PSU slots have been processed. If all slots have been processed, method 400 may proceed to step 416. Otherwise, method 400 may proceed again to step 406.

At step 416, chassis management controller 112 may attempt to read a current consumed by air movers of cooling system 140. At step 418, chassis management controller 112 may determine if the attempt was successful. If the attempt was not successful, method 400 may proceed to step 420. Otherwise, method 400 may proceed to step 426.

At step 420, chassis management controller 112 may determine if the counter variable "Fan.MissedRds" has reached a threshold value (e.g., 10). If the counter "Fan.MissedRds" has reached the threshold value, the attempt to read the air mover current has failed at least a consecutive number of times equal to the threshold value, meaning a period of time (e.g., five seconds in the case of a threshold value of 10) has passed since the last successful read of the air mover power consumption. If the counter "Fan.MissedRds" has reached the threshold value, method 400 may proceed to step 422. Otherwise, method 400 may proceed to step 424.

At step 422, chassis management controller 112 may set the variable "Fan.Pwr" to a default maximum worst-case power consumption level (e.g., 170 watts). After completion of step 422, method 400 may proceed to step 428.

At step 424, chassis management controller 112 may increment the counter "Fan.MissedRds." After completion of step 424, method 400 may proceed to step 428.

At step 426, chassis management controller 112 may use the air mover current read at step 416 to determine an air mover power consumption level, and store such air mover power consumption level as variable "Fan.Pwr." At step 427, chassis management controller 112 may clear the variable "Fan.MissedRds" to 0.

At step 428, chassis management controller 112 may determine if the presence of disk-drive backplane 128 is detected. If no disk-drive backplane 128 is present, method 400 may proceed to step 454. If disk-drive backplane 128 is present, method 400 may proceed to step 430.

At step 430, chassis management controller 112 may attempt to read a current consumed by disk-drive backplane 128. At step 432, chassis management controller 112 may determine if the attempt was successful. If the attempt was not successful, method 400 may proceed to step 434. Otherwise, method 400 may proceed to step 444.

At step 434, chassis management controller 112 may determine if the counter variable "BP.MissedRds" has reached a threshold value (e.g., 10). If the counter "BP.MissedRds" has reached the threshold value, the attempt to read the backplane current has failed at least a consecutive number of times equal to the threshold value, meaning a period of time (e.g., five seconds in the case of a threshold value of 10) has passed since the last successful read of the backplane power consumption. If the counter "BP.MissedRds" has reached the threshold value, method 400 may proceed to step 450. Otherwise, method 400 may proceed to step 448.

At step 444, chassis management controller 112 may use the backplane current read at step 430 to determine a backplane power consumption level, and store such backplane power consumption level as variable "BP.Pwr." At step 446, chassis management controller 112 may clear the variable "BP.MissedRds" to 0. After completion of step 446, method 400 may proceed to step 456.

At step 448, chassis management controller 112 may increment the counter "BP.MissedRds." After completion of step 448, method 400 may proceed to step 456.

At step 450, chassis management controller 112 may set the variable "BP.Pwr" to the default power consumption level "BP.DfltPwr" determined by method 300. After completion of step 450, method 400 may proceed to step 456.

At step 454, in the absence of disk drive backplane 128, chassis management controller 112 may set the variable "BP.Pwr" to 0 watts.

At step 456, chassis management controller 112 may initialize a sled bay indicator "Bay" to 1, indicating the first bay. At step 458, chassis management controller 112 may initialize a "MissedSledRds" to 0. At step 460, chassis management controller 112 may determine if a sled 102 is present in the sled bay indicated by sled bay indicator "Bay." If a sled 102 is present in the sled bay indicated by sled bay indicator "Bay," method 400 may proceed to step 462. Otherwise, method 400 may proceed to step 470.

At step 462, chassis management controller 112 may communicate an IPMI command host management controller 105 of sled 102 to read a power consumption level for sled 102. At step 464, chassis management controller 112 may determine if the attempt was successful. If the attempt was not successful, method 400 may proceed to step 466. Otherwise, if the attempt was successful, method 400 may proceed to step 465.

At step 465, chassis management controller 112 may store the power level read at step 462 as variable "Sled[Bay].Pwr." After completion of step 465, method 400 may proceed to step 472.

At step 466, chassis management controller 112 may increment the counter "MissedSledRds." At step 468, chassis management controller 112 may assign a value of 0 (or FALSE) to variable "Sled[Bay].PwrRd." At step 470, chassis management controller 112 may assign a value of 0 to variable "Sled[Bay].Pwr."

At step 472, chassis management controller 112 may assign a value of 1 (or TRUE) to variable "Sled[Bay].PwrRd." At step 474, chassis management controller 112 may increment sled bay indicator "Bay."

At step 476, chassis management controller 112 may determine if all sled bays have been processed. If all sled bays have been processed, method 400 may proceed to step 478. Otherwise, if not all sled bays have been processed, method 400 may proceed again to step 460.

At step 478, chassis management controller 112 may initialize sled bay indicator "Bay" to 1, indicating the first bay. At step 480, chassis management controller 112 may determine if a sled 102 is present in the sled bay indicated by sled bay indicator "Bay." If a sled 102 is present in the sled bay indicated by sled bay indicator "Bay," method 400 may proceed to step 482. Otherwise, method 400 may proceed to step 486.

At step 482, chassis management controller 112 may determine whether the sled power for the sled 102 indicated by sled bay indicator "Bay" was successfully read at step 462. If "Sled[Bay].PwrRd" is 1 (or TRUE), the read was successful and method 400 may proceed to step 486. Otherwise, if Sled[Bay].PwrRd" is 0 (or FALSE), the read was unsuccessful and method 400 may proceed to step 484.

At step 484, chassis management controller 112 may calculate an estimated power consumption of sled 102 by adding up the power supplied to chassis 101 by PSUs 133, and then subtracting the power consumed by cooling system 140, the power consumed by disk drive backplane 128, the power consumed by chassis management controllers 112, and the sled power readings that were successfully obtained from host management controllers 105. Chassis management controller 112 may then divide such result by the number of failed sled power readings as indicated by "MissedSledRds."

At step 486, chassis management controller 112 may increment sled bay indicator "Bay." At step 488, chassis management controller 112 may determine if all sled bays have been processed for estimating power consumption of those sleds for which a direct power reading was unsuccessful. If all sled bays have been processed, method 400 may end. Otherwise, if not all sled bays have been processed, method 400 may proceed again to step 480.

Although FIG. 4 discloses a particular number of steps to be taken with respect to method 400, method 400 may be executed with greater or fewer steps than those depicted in FIG. 4. In addition, although FIG. 4 discloses a certain order of steps to be taken with respect to method 400, the steps comprising method 400 may be completed in any suitable order.

Method 400 may be implemented using system 100, components thereof, or any other system such as those shown in FIG. 1 operable to implement method 400. In certain embodiments, method 400 may be implemented partially or fully in software and/or firmware embodied in computer-readable media.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the figures and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising:
a chassis comprising a plurality of bays, each of the plurality of bays configured to receive a respective modular information handling system;
a shared infrastructure comprising a plurality of components which are shared by modular information handling systems received in the plurality of bays; and
a chassis management controller communicatively coupled to the plurality of bays and configured to:
determine a power consumption for each respective modular information handling system by:
reading the power consumption for each respective modular information handling system from a host management controller of each respective modular information handling system; and
if reading the power consumption for a particular modular information handling system is unsuccessful, estimating the power consumption for the particular modular information handling system by:
determining power delivered by power supply units supplying electrical energy to the plurality of bays and the shared infrastructure;
determining a shared infrastructure power consumption indicative of power consumed by the shared infrastructure;
determining a sled power consumption indicative of power consumed by modular information handling systems populated in the plurality of bays for which reading the power consumption for such modular information handling systems was successful; and estimating the power consumption for the particular modular information handling system based on the power delivered, the shared infrastructure power consumption, and the sled power consumption; and if the power consumption for a respective modular information handling system exceeds a maximum sled connector current limit for the respective modular information handling system, communicate a message to the respective modular information handling system to power down the respective modular information handling system.

2. The system of claim 1, wherein the chassis management controller is further configured to power off the chassis by disabling power supply units supplying electrical energy to the plurality of bays in the event that the respective modular information handling system does not power down within a maximum shutdown time limit.

3. The system of claim 1, wherein the shared infrastructure power consumption comprises a power consumed by a cooling system for the chassis.

4. The system of claim 1, wherein the shared infrastructure power consumption comprises a backplane power consumption indicative of power consumed by a disk drive backplane of the chassis.

5. The system of claim 4, wherein the chassis management controller is configured to determine the backplane power consumption by:

monitoring a current associated with the disk drive backplane; and if monitoring the current is unsuccessful, estimating the backplane power consumption based on a type associated with the disk drive backplane.

6. A method comprising, in a system comprising a chassis comprising a plurality of bays, each of the plurality of bays configured to receive a respective modular information handling system, and the system further comprising a shared infrastructure comprising a plurality of components which are shared by modular information handling systems received in the plurality of bays:

determining a power consumption for each respective modular information handling system by:

reading the power consumption for each respective modular information handling system from a host management controller of each respective modular information handling system; and if reading the power consumption for a particular modular information handling system is unsuccessful, estimating the power consumption for the particular modular information handling system by:

determining power delivered by power supply units supplying electrical energy to the plurality of bays and the shared infrastructure;

determining a shared infrastructure power consumption indicative of power consumed by the shared infrastructure;

determining a sled power consumption indicative of power consumed by modular information handling systems populated in the plurality of bays for which reading the power consumption for such modular information handling systems was successful; and estimating the power consumption for the particular modular information handling system based on the power delivered, the shared infrastructure power consumption, and the sled power consumption; and if the power consumption for a respective modular information handling system exceeds a maximum sled connector current limit for the respective modular information handling system, communicating a message to the respective modular information handling system to power down the respective modular information handling system.

7. The method of claim 6, further comprising powering off the chassis by disabling power supply units supplying electrical energy to the plurality of bays in the event that the respective modular information handling system does not power down within a maximum shutdown time limit.

8. The method of claim 6, wherein the shared infrastructure power consumption comprises a power consumed by a cooling system for the chassis.

9. The method of claim 6, wherein the shared infrastructure power consumption comprises a backplane power consumption indicative of power consumed by a disk drive backplane of the chassis.

10. The method of claim 9, further comprising determining the backplane power consumption by:

monitoring a current associated with the disk drive backplane; and if monitoring the current is unsuccessful, estimating the backplane power consumption based on a type associated with the disk drive backplane.

11. An article of manufacture comprising:

a non-transitory computer readable medium; and computer-executable instructions carried on the computer readable medium, the instructions readable by a processor, the instructions, when read and executed, for causing the processor to, in a system comprising a chassis comprising a plurality of bays, each of the plurality of bays configured to receive a respective modular information handling system, and the system further comprising a shared infrastructure comprising a plurality of components which are shared by modular information handling systems received in the plurality of bays:

determine a power consumption for each respective modular information handling system by:

reading the power consumption for each respective modular information handling system from a host management controller of each respective modular information handling system; and if reading the power consumption for a particular modular information handling system is unsuccessful, estimating the power consumption for the particular modular information handling system by:

determining power delivered by power supply units supplying electrical energy to the plurality of bays and the shared infrastructure;

determining a shared infrastructure power consumption indicative of power consumed by the shared infrastructure;

determining a sled power consumption indicative of power consumed by modular information handling systems populated in the plurality of bays for which reading the power consumption for such modular information handling systems was successful; and estimating the power consumption for the particular modular information handling system based on the power delivered, the shared infrastructure power consumption, and the sled power consumption; and if the power consumption for a respective modular information handling system exceeds a maximum sled connector current limit for the respective modular information handling system, communicate a message to the respective modular information handling system to power down the respective modular information handling system.

12. The article of claim 11, the instructions for further causing the processor to power off the chassis by disabling power supply units supplying electrical energy to the plurality of bays in the event that the respective modular information handling system does not power down within a maximum shutdown time limit.

13. The article of claim 11, wherein the shared infrastructure power consumption comprises a power consumed by a cooling system for the chassis.

14. The article of claim 11, wherein the shared infrastructure power consumption comprises a backplane power consumption indicative of power consumed by a disk drive backplane of the chassis.

15. The article of claim 14, the instructions for further causing the processor to determine the backplane power consumption by:
   monitoring a current associated with the disk drive backplane; and
   if monitoring the current is unsuccessful, estimating the backplane power consumption based on a type associated with the disk drive backplane.

\* \* \* \* \*

UNITED STATES PATENT AND TRADEMARK OFFICE
CERTIFICATE OF CORRECTION

| | |
|---|---|
| PATENT NO. | : 11,910,558 B2 |
| APPLICATION NO. | : 17/229602 |
| DATED | : February 20, 2024 |
| INVENTOR(S) | : Dillon et al. |

Page 1 of 1

It is certified that error appears in the above-identified patent and that said Letters Patent is hereby corrected as shown below:

In the Specification

In Column 12, Line 56, delete "Sled[Bay]._" and insert -- "Sled[Bay].OC_Tmr" --, therefor.

Signed and Sealed this
Ninth Day of April, 2024

Katherine Kelly Vidal
*Director of the United States Patent and Trademark Office*